US009275772B2

United States Patent
Pham et al.

(10) Patent No.: US 9,275,772 B2
(45) Date of Patent: Mar. 1, 2016

(54) ELECTROCONDUCTIVE PASTE COMPOSITION

(75) Inventors: Tung T. Pham, West Conshohocken, PA (US); Weiming Zhang, West Conshocken, PA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 546 days.

(21) Appl. No.: 13/472,278

(22) Filed: May 15, 2012
(Under 37 CFR 1.47)

(65) Prior Publication Data
US 2013/0092225 A1 Apr. 18, 2013

Related U.S. Application Data

(63) Continuation of application No. PCT/US2010/056651, filed on Nov. 15, 2010.

(60) Provisional application No. 61/261,508, filed on Nov. 16, 2009.

(51) Int. Cl.
*H01B 1/22* (2006.01)
*H01L 31/0224* (2006.01)
*B82Y 30/00* (2011.01)

(52) U.S. Cl.
CPC .......... *H01B 1/22* (2013.01); *H01L 31/022425* (2013.01); *B82Y 30/00* (2013.01); *Y02E 10/50* (2013.01); *Y10S 977/773* (2013.01); *Y10S 977/81* (2013.01)

(58) Field of Classification Search
CPC .............. H01B 1/00; H01B 1/16; H01B 1/22; H05K 1/092; H01L 31/0224; H01L 35/14; H01L 35/24
See application file for complete search history.

(56) References Cited

U.S. PATENT DOCUMENTS

| | | | | |
|---|---|---|---|---|
| 5,422,190 | A | * 6/1995 | Alexander | 428/552 |
| 5,948,320 | A | 9/1999 | Nikaidoh et al. | |
| 7,704,416 | B2 | * 4/2010 | Inaba et al. | 252/514 |
| 2007/0187652 | A1 | * 8/2007 | Konno | 252/500 |
| 2008/0230119 | A1 | * 9/2008 | Akimoto | 136/255 |
| 2009/0004369 | A1 | 1/2009 | Inaba et al. | |
| 2009/0169724 | A1 | 7/2009 | Ogiwara | |
| 2009/0211626 | A1 | * 8/2009 | Akimoto | 136/252 |
| 2009/0255584 | A1 | * 10/2009 | Carroll | C03C 3/072 136/261 |
| 2009/0298283 | A1 | * 12/2009 | Akimoto et al. | 438/660 |
| 2010/0059106 | A1 | * 3/2010 | Akimoto | H01B 1/16 136/252 |
| 2010/0065790 | A1 | * 3/2010 | Dietz et al. | 252/514 |

FOREIGN PATENT DOCUMENTS

| | | |
|---|---|---|
| JP | H1140933 A | 2/1999 |
| JP | 2004-175602 A | 6/2004 |
| JP | 2006-321976 A | 11/2006 |
| JP | 2007194580 A | 8/2007 |

(Continued)

*Primary Examiner* — Mark Kopec
(74) *Attorney, Agent, or Firm* — Blank Rome LLP

(57) ABSTRACT

An electroconductive paste composition, particularly for solar cells, contains silver particles, glass particles, an organic vehicle, and at least one additive. The additive may be tantalum pentoxide or fine, electrically conductive, metal particles, such as gold and/or platinum group metals. When used to form an electrical contact on a solar cell, such a paste provides for enhanced adhesion of the contact to the cell and improved electron transmission.

7 Claims, 1 Drawing Sheet

(56) References Cited

FOREIGN PATENT DOCUMENTS

| | | | |
|---|---|---|---|
| JP | 2008042095 A | 2/2008 |
| JP | 2008-050806 A | 3/2008 |
| JP | 2008135190 A | 6/2008 |
| JP | 2009-176728 A | 8/2009 |

* cited by examiner

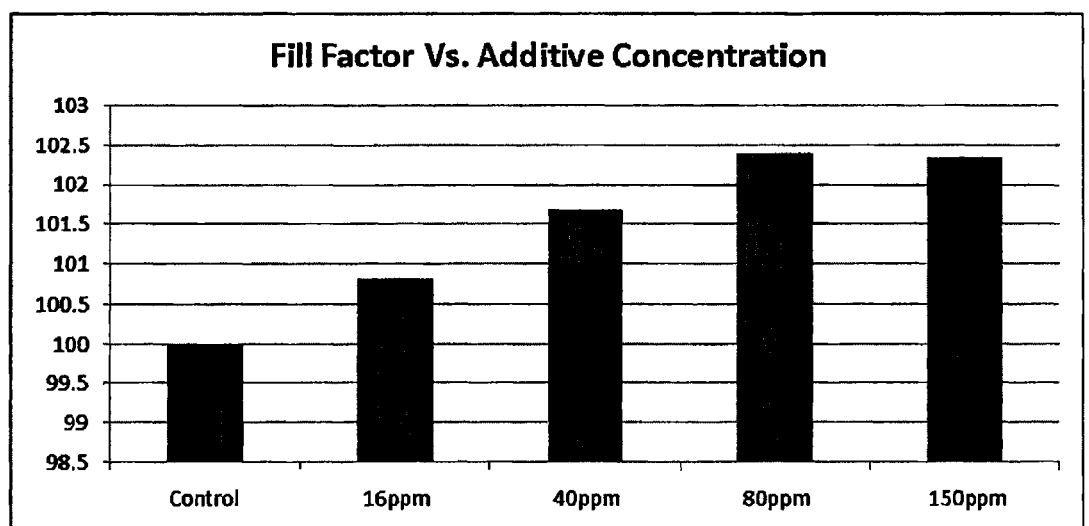

ELECTROCONDUCTIVE PASTE COMPOSITION

CROSS-REFERENCE TO RELATED APPLICATIONS

This application is a continuation of international application PCT/US2010/056651, filed on Nov. 15, 2010, which claims priority to U.S. Provisional Patent Application No. 61/261,508, filed Nov. 16, 2009, the disclosure of which is herein incorporated by reference in its entirety.

BACKGROUND OF THE INVENTION

Solar cells are devices that convert the sun's energy into electricity using the photovoltaic effect. Solar power is an attractive energy source because it is sustainable and non-polluting. Accordingly, a great deal of research is currently being devoted to developing solar cells with enhanced efficiency while maintaining low material and manufacturing costs. Very simply, when photons in sunlight hit a solar panel, they are absorbed by semiconducting materials, such as silicon. Electrons are knocked loose from their atoms, allowing them to flow through electroconductive parts of the solar panel and produce electricity.

The most common solar cells are those based on silicon, more particularly, a p-n junction made from silicon by applying an n-type diffusion layer onto a p-type silicon substrate, coupled with two electrical contact layers or electrodes. In order to minimize reflection of the sunlight by the solar cell, an antireflection coating, such as silicon nitride, is applied to the n-type diffusion layer to increase the amount of light coupled into the solar cell. Using a silver paste, for example, a grid-like metal contact may be screen printed onto the antireflection layer to serve as a front electrode. This electrical contact layer on the face or front of the cell, where light enters, is typically present in a grid pattern made of "finger lines" and "bus bars" rather than a complete layer because the metal grid materials are not transparent to light. Finally, a rear contact is applied to the substrate, such as by applying a backside silver or silver/aluminum paste followed by an aluminum paste to the entire backside of the substrate. The device is then fired at a high temperature to convert the metal pastes to metal electrodes. A description of a typical solar cell and the fabrication method thereof may be found, for example, in European Patent Application Publication No. 1 713 093.

A typical silver paste comprises silver particles, glass frit (glass particles), a metal oxide additive, such as zirconium oxide or tin oxide to enhance binding of the composition to the solar panel, and an organic vehicle. These components must be carefully selected to take full advantage of the potential of the resulting solar cell. For example, it is necessary to maximize the contact between the silver particles and the Si surface so that the charge carriers can flow through the finger lines to the bus bars. If the resistance is too high, the charge carriers are blocked. Thus, minimizing contact resistance is desired. Additionally, the glass particles in the composition etch through the antireflection coating layer, resulting in contact between the Ag particles and the Si surface. However, the glass must not be so aggressive that it penetrates the p-n junction. Finally, known compositions have high contact resistance due to the insulating effect of the glass in the interface of silver layer and Si wafer, and other disadvantages such as high recombination in the contact area. Accordingly, silver paste compositions which can overcome these known disadvantages would be desirable.

BRIEF SUMMARY OF THE INVENTION

An electroconductive paste composition according to one embodiment of the invention comprises:
(a) silver particles;
(b) glass frit;
(c) fine, electrically conductive, gold and/or platinum group metal particles preferably selected from the group consisting of gold, palladium, and platinum, wherein the metal particles have a particle size of about 1 nm to about 1 micron and are present in an amount of about 0.0001 to less than 0.01 wt % based on the weight of the paste composition; and
(d) an organic vehicle.

An electroconductive paste composition according to a second embodiment of the invention comprises:
(a) silver particles;
(b) glass frit;
(c) tantalum pentoxide particles having a particle size of less than about 5 microns; and
(d) an organic vehicle.

An electroconductive paste composition according to a third embodiment of the invention comprises:
(a) silver particles;
(b) glass frit;
(c) fine, electrically conductive, gold particles, wherein the gold particles have a particle size of about 1 nm to about 1 micron and are present in an amount of about 0.0001 to less than 0.1 wt % based on the weight of the paste composition; and
(d) an organic vehicle.

A solar cell electrode according to a first embodiment of the invention is formed by applying an electroconductive paste composition to a substrate and firing the paste to form the electrode, wherein the electroconductive paste composition comprises:
(a) silver particles;
(b) glass frit;
(c) fine, electrically conductive, metal particles selected from the group consisting of gold and platinum group metals, wherein the metal particles have a particle diameter of about 1 nm to about 1 micron and are present in an amount of about 0.0001 to less than 0.01 wt % based on the weight of the paste composition; and
(d) an organic vehicle.

A solar cell electrode according to a second embodiment of the invention is formed by applying an electroconductive paste composition to a substrate and firing the paste to form the electrode, wherein the electroconductive paste composition comprises:
(a) silver particles;
(b) glass frit;
(c) tantalum pentoxide particles having a particle diameter of less than about 5 microns; and
(d) an organic vehicle.

A solar cell electrode according to a third embodiment of the invention is formed by applying an electroconductive paste composition to a substrate and firing the paste to form the electrode, wherein the electroconductive paste composition comprises:
(a) silver particles;
(b) glass frit;
(c) fine, electrically conductive, gold particles, wherein the gold particles have a particle diameter of about 1 nm to about 1 micron and are present in an amount of about 0.0001 to less than 0.1 wt % based on the weight of the paste composition; and (d) an organic vehicle.

BRIEF DESCRIPTION OF THE DRAWINGS

The foregoing summary, as well as the following detailed description of the invention, will be better understood when read in conjunction with the appended drawing. For the purpose of illustrating the invention, there are shown in the drawings embodiments which are presently preferred. It should be understood, however, that the invention is not limited to the precise arrangements and instrumentalities shown. In the drawings:

FIG. 1 is a graph of fill factor vs. additive concentration according to one embodiment of the present invention.

DETAILED DESCRIPTION OF THE INVENTION

The electroconductive paste composition according to the invention comprises four essential components: silver particles, glass frit, at least one particulate additive, and an organic vehicle. The additive may comprise specific fine metal particles and/or tantalum pentoxide ($TaO_5$) particles. As described in more detail below, these additives provide enhanced electron transmission and better adhesion of the paste composition to a substrate. While not limited to such an application, such a paste may be used to form an electrical contact layer or electrode in a solar cell.

Each component in the electroconductive paste composition will now be described in more detail.

Silver Particles

The silver particles function as an electroconductive metal in the electroconductive paste composition. It is also within the scope of the invention to utilize other electroconductive metals in place of or in addition to silver, such as copper, as well as mixtures containing silver, copper, gold, palladium, and/or platinum. Alternatively, alloys of these metals may also be utilized as the electroconductive metal. The silver particles may be included in the composition in powder or flake form, such as silver powder having a particle diameter of about 0.3 to about 10 microns. Unless otherwise indicated herein, all particle sizes stated herein are $d_{50}$ particle diameters measured by laser diffraction. As well understood by those in the art, the $d_{50}$ diameter represents the size at which half of the individual particles (by weight) are smaller than the specified diameter. Such diameters provide the silver with suitable sintering behavior and spreading of the electroconductive paste on the antireflection layer when forming a solar cell, as well as appropriate contact formation and conductivity of the resulting solar cell. The silver particles are preferably present in the composition in an amount of about 40 to about 95% by weight based on the total weight of the composition, more preferably about 70 to 90 wt %.

Glass Frit

The glass frit (glass particles) functions as an inorganic binder in the electroconductive paste composition and acts as the transport media to deposit silver onto the substrate during firing. The glass system is important for controlling the size and depth of the silver deposited onto the substrate. The specific type of glass is not critical provided that it can give the desired properties to the paste composition. Preferred glasses include lead borosilicate and bismuth borosilicate, but other lead-free glasses, such as zinc borosilicate, would also be appropriate. The glass particles preferably have a particle size of about 0.1 to about 10 microns, more preferably less than about 5 microns, and are preferably contained in the composition in an amount of about 0.5 to about 6 weight %, more preferably less than about 5 weight % based on the total weight of the paste composition. Such amounts provide the composition with appropriate adhesive strength and sintering properties.

Organic Vehicle

The particular organic vehicle or binder is not critical and may be one known in the art or to be developed for this type of application. For example, a preferred organic vehicle contains a cellulose resin and a solvent, such as ethylcellulose in a solvent such as terpineol. The organic vehicle is preferably present in the electroconductive paste composition in an amount of about 5 to about 30% by weight, more preferably less than about 20% by weight based on the total weight of the composition.

Additive

Two different types of additives may be included in the electroconductive paste composition according to the invention; these additives may be included singly or in combination.

A first type of additive according to the invention comprises fine, electrically conductive, metal particles, preferably particles of a highly conductive noble or precious metal. Preferably, the metal is selected from gold and platinum group metals, such as palladium and platinum. More preferably, the additive comprises fine gold particles and/or platinum particles. The fine metal particles preferably have a diameter of about 1 nm to less than 3 microns, more preferably about 1 nm to about 1 micron, even more preferably less than about 1 micron, most preferably about 1 to about 500 nm. In one preferred embodiment, the fine metal particles have a diameter of less than about 100 nm. However, it is also within the scope of the invention to utilize a noble or precious metal resin organic compound, such as a gold resinate, as the additive in the paste composition. The fine metal particles are preferably contained in the electroconductive paste composition in an amount of about 0.0001 wt % (1 ppm) to about 5 weight %, more preferably about 0.0001 to about 2 wt %, even more preferably about 0.0001 to about 0.5 wt %, based on the total weight of the paste composition. In preferred embodiments, the fine metal particles are contained in an amount of about 0.0001 wt % to less than about 0.1 wt %, or less than about 0.01 wt %.

The fine metal particles are included in the composition to provide enhanced electron transmission. It has been found that because of the small particle size, gold, for example, disperses easily in the glass layer and helps make the glass conductive. Glass is basically an insulator, and the solar cell charge carriers need to go through the glass layer in the interface of Ag electrode and wafer to minimize charge loss. Gold, however, is a good conductor, so that uniformly dispersed fine particles of gold can create an electrical tunneling effect through the glass insulation layer. As explained above, it is also within the scope of the invention to include both fine metal particles and tantalum oxide particles in the electroconductive paste composition according to the invention.

A second type of additive comprises tantalum pentoxide ($Ta_2O_5$) particles, which are preferably present in the electroconductive paste composition in an amount of about 0.1 to about 5 weight %, preferably less than about 2 wt %, more preferably less than about 1 wt %, based on the total weight of the paste composition. The tantalum pentoxide particles preferably have a particle size less than 5 microns.

The $Ta_2O_5$ provides for better adhesion of the electroconductive composition to the silicon surface. A typical solar cell has a SiN antireflection layer having a textured surface to prevent reflection. Usually, $SiO_x$ is added as a passivation layer between the SiN and the p-n junction to fix surface defects in the textured layer. It is believed that the $Ta_2O_5$ reacts with the $SiO_x$ and SiN to help penetration of the silver paste through the passivation layer, thus improving contact between the silver and the p-n junction.

It is also within the scope of the invention to include additional additives in the electroconductive paste composition. For example, it may be desirable to include thickener (tackifier), stabilizer, dispersant, viscosity adjuster, etc. compounds, alone or in combination. Such components are well known in the art. The amounts of such components, if included, may be determined by routine experimentation depending on the properties of the electroconductive paste that are desired.

The electroconductive paste composition may be prepared by any method for preparing a paste composition known in the art or to be developed; the method of preparation is not critical. For example, the glass particles may be coated with the fine metal particles (optionally suspended in a liquid medium such as diethylene glycol or butyl carbitol acetate) so that the small metal particles adhere to the larger glass particles. The coated glass particles may then be mixed with the silver particles and organic vehicle to form a paste. Alternatively, the fine metal particles may be suspended in a liquid medium, such as diethylene glycol or butyl carbitol acetate. The paste components may then be mixed, such as with a mixer, then passed through a three roll mill, for example, to make a dispersed uniform paste. It is within the scope of the invention to include the additive in powder form or suspended in a liquid medium.

Such a paste may then be utilized to form a solar cell by application of the paste to the antireflection layer on a substrate, such as by screen printing, and then firing to form an electrode (electrical contact) on the silicon substrate. Such a method of fabrication is well known in the art and described in EP 1 713 093, for example.

It has been found that utilization of the inventive electroconductive paste provides a solar cell with improved properties, higher conversion efficiency.

The invention will now be described in conjunction with the following, non-limiting examples.

Example 1

Variation in Gold Additive Level

Four electroconductive pastes were prepared by combining the components (silver powder, glass, additives, and organics) of a commercially available silver conductive paste, SOL953, commercially available from Heraeus Materials Technology LLC (W. Conshohocken, Pa.), and a gold additive (commercially available from Heraeus) having a particle size ($d_{50}$) of 4 nm. The gold, suspended in butyl carbitol acetate as a liquid medium, was coated onto the glass particles in the commercial paste. Pastes 1-4 contained different amounts of gold: 16 ppm (Paste 1), 40 ppm (Paste 2), 80 ppm (Paste 3), or 160 ppm (Paste 4), all amounts being based on the total weight of the resulting paste.

Six types of solar cells were prepared as follows: On the backside of a ready-to-be metalized P-type multi-crystalline (mc) or mono-crystalline (sc) solar wafer having a sheet resistance of 100Ω/□ (mc) or 55Ω/□ (sc), an aluminum paste (RuXing 8252X) was printed and dried at 150° C. A silver paste selected from Pastes 1-4 was applied to the front side of the water, printed, and dried at 150° C. Paste 1 was applied to a multi-crystalline wafer and Pastes 2-4 were applied to mono-crystalline wafers. The cells were then co-fired in a furnace at a temperature of 750-800° C. for a few seconds. Multiple solar cells were prepared using each of Pastes 1-4. Two additional types of solar cells were prepared as controls using the commercially available paste with no additive: one control on a mono-crystalline solar wafer and one control on a multi-crystalline solar wafer.

The resulting solar cells were tested using an I-V tester. The Xe arc lamp in the I-V tester was simulated using sunlight with a known intensity and the front surface of the solar cell was irradiated to generate the I-V curve. Using this curve, the following parameters, which provide for electrical performance comparison, were determined: short circuit current density (Jsc), short circuit current (Isc), open circuit voltage (Voc), fill factor (FF), shunt resistance (Rsh), series resistance (Rs), and energy conversion efficiency (EFF). Fill factor data was used for comparison: the fill factors of the control cells were equated with "100%" and the fill factors of the inventive cells were calculated accordingly based on the fill factor of the appropriate control cell. That is, the fill factor of Control Cell I was used as the baseline for the cell prepared using Paste 1, and the fill factor of Control Cell II was used as the baseline for the cells prepared using Pastes 2-4.

The electrical performance data for the cells prepared using Pastes 1-4, as well as the comparative cells, are tabulated in Table 1 below and depicted graphically in FIG. 1. It can be seen that very low additive levels, from 16 to 150 ppm of gold, provided positive effects. Further, higher amounts of gold resulted in improved performance.

Example 2

Variation of Additive Source

Two pastes ("Paste A" and "Paste B") were prepared as described in Example 1. Paste B contained 40 ppm of gold having a $d_{50}$ particle size of 4 nm, which was added in suspension form as described in Example 1. Paste A contained 40 ppm of gold (also commercially available from Heraeus), which was added in powder form, and had a $d_{50}$ of 100 nm. Solar cells were prepared as described in Example 1 using a single (mono) crystalline (sc) silicon wafer. The resulting solar cells, as well as a cell prepared using the commercial SOL953 paste as a control, were analyzed as described in Example 1. The electrical performance data for the cells prepared using Pastes A, B, and the control, as well as the average value for each Paste, are tabulated in Table 2. It can be seen that both inventive Pastes A and B exhibited superior results relative to the comparative paste: higher fill factor, higher efficiency, and lower series resistance. Further, Paste B, containing a gold additive with 4 nm particle size, was superior to Paste A, in which the gold had a particle size of 100 nm.

TABLE 1

Comparison of Different Gold Additive Levels in Conductive Pastes

|  | wafer type | Sheet (Ohm/) | Au (ppm) | Isc | Jsc | Voc | FF | EFF | Rs | Rsh |
|---|---|---|---|---|---|---|---|---|---|---|
| Control Cell I | mc-Si | 100 | 0 | 8.31979 | 34.18717 | 0.622432 | 76.64721 | 16.3099079 | 0.004109 | 123.3974 |
|  | mc-Si | 100 | 0 | 8.362173 | 34.36133 | 0.623048 | 75.72379 | 16.2115211 | 0.005235 | 40.77006 |
|  | mc-Si | 100 | 0 | 8.410937 | 34.56171 | 0.620947 | 74.97146 | 16.0896053 | 0.005331 | 104.9059 |
|  |  | Average |  | 8.3643 | 34.37007 | 0.622142 | 75.78082 | 16.2036781 | 0.004892 | 89.69109 |

TABLE 1-continued

Comparison of Different Gold Additive Levels in Conductive Pastes

|  | wafer type | Sheet (Ohm/) | Au (ppm) | Isc | Jsc | Voc | FF | EFF | Rs | Rsh |
|---|---|---|---|---|---|---|---|---|---|---|
| Cell with Paste 1 | mc-Si | 100 | 16 | 8.34228 | 34.27959 | 0.620953 | 76.133133 | 16.20572 | 0.004614 | 116.994064 |
|  | mc-Si | 100 | 16 | 8.346463 | 34.29678 | 0.623391 | 76.321785 | 16.31783 | 0.004803 | 81.0779572 |
|  | mc-Si | 100 | 16 | 8.35969 | 34.35112 | 0.624148 | 76.830643 | 16.47264 | 0.004151 | 299.071045 |
|  | Average |  |  | 8.349478 | 34.30916 | 0.622831 | 76.42852 | 16.33206 | 0.004523 | 165.714355 |
| Control Cell II | sc-Si | 55 | 0 | 8.616 | 36.126 | 0.6286 | 77.55 | 17.61 | 4.37E−03 | 3.19E+01 |
|  | sc-Si | 55 | 0 | 8.563 | 36.13 | 0.6289 | 77.4 | 17.59 | 4.42E−03 | 4.38E+01 |
|  | sc-Si | 55 | 0 | 8.663 | 36.322 | 0.6272 | 77.86 | 17.74 | 3.90E−03 | 5.63E+01 |
|  | Average |  |  | 8.614 | 36.19267 | 0.628233 | 77.60333 | 17.646667 | 0.00423 | 44 |
| Cell with Paste 2 | sc-Si | 55 | 40 | 8.611 | 36.104 | 0.6285 | 78.54 | 17.82 | 3.64E−03 | 3.03E+01 |
|  | sc-Si | 55 | 40 | 8.586 | 36 | 0.6278 | 79.35 | 17.93 | 3.03E−03 | 3.18E+01 |
|  | sc-Si | 55 | 40 | 8.564 | 35.909 | 0.6277 | 78.84 | 17.77 | 3.26E−03 | 4.23E+01 |
|  | Average |  |  | 8.587 | 36.00433 | 0.628 | 78.91 | 17.84 | 0.00331 | 34.8 |
| Cell with Paste 3 | sc-Si | 55 | 80 | 8.409 | 34.546 | 0.6299 | 79.53 | 17.31 | 2.91E−03 | 2.57E+01 |
|  | sc-Si | 55 | 80 | 8.459 | 34.752 | 0.6294 | 79.4 | 17.37 | 3.08E−03 | 2.18E+01 |
|  | Average |  |  | 8.434 | 34.649 | 0.62965 | 79.465 | 17.34 | 0.002995 | 23.75 |
| Cell with Paste 4 | sc-Si | 55 | 150 | 8.464 | 34.776 | 0.6293 | 79.57 | 17.41 | 2.95E−03 | 3.77E+01 |
|  | sc-Si | 55 | 150 | 8.462 | 34.768 | 0.629 | 79.26 | 17.33 | 3.04E−03 | 2.74E+01 |
|  | Average |  |  | 8.463 | 34.772 | 0.62915 | 79.415 | 17.37 | 0.002995 | 32.55 |

TABLE 2

Comparison of Different Gold Additive Sizes

|  | wafer type | Sheet (Ohm/) | Au (ppm) | Au form | PSD (nm) | Isc | Jsc | Voc | FF | EFF | Rs | Rsh |
|---|---|---|---|---|---|---|---|---|---|---|---|---|
| Control Cell | sc-Si | 55 | 0 | N/A |  | 8.616 | 36.126 | 0.62860 | 77.55 | 17.61 | 0.0043700 | 31.9 |
|  | sc-Si | 55 | 0 | N/A |  | 8.563 | 36.130 | 0.62890 | 77.40 | 17.59 | 0.0044200 | 43.8 |
|  | sc-Si | 55 | 0 | N/A |  | 8.663 | 36.322 | 0.62720 | 77.86 | 17.74 | 0.0039000 | 56.3 |
|  | Average |  |  |  |  | 8.614 | 36.193 | 0.628 | 77.603 | 17.647 | 0.004230 | 44.0 |
| Cell with Paste A | sc-Si | 55 | 40 | Powder | 100 | 8.652 | 36.275 | 0.62980 | 78.54 | 17.94 | 0.0037000 | 32.4 |
|  | sc-Si | 55 | 40 | Powder | 100 | 8.630 | 36.183 | 0.62930 | 78.46 | 17.86 | 0.0036800 | 38.6 |
|  | sc-Si | 55 | 40 | Powder | 100 | 8.647 | 36.256 | 0.62880 | 78.63 | 17.93 | 0.0034700 | 41.6 |
|  | Average |  |  |  |  | 8.643 | 36.238 | 0.629 | 78.543 | 17.910 | 0.003617 | 37.5 |
| Cell with Paste B | sc-Si | 55 | 40 | Liquid | 4 | 8.611 | 36.104 | 0.62850 | 78.54 | 17.82 | 0.0036400 | 30.3 |
|  | sc-Si | 55 | 40 | Liquid | 4 | 8.586 | 36.000 | 0.62780 | 79.35 | 17.93 | 0.0030300 | 31.8 |
|  | sc-Si | 55 | 40 | Liquid | 4 | 8.564 | 35.909 | 0.62770 | 78.84 | 17.77 | 0.0032600 | 42.3 |
|  | Average |  |  |  |  | 8.587 | 36.004 | 0.628 | 78.910 | 17.840 | 0.003310 | 34.8 |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An electroconductive paste composition comprising:
   (a) silver particles;
   (b) glass frit;
   (c) fine, electrically conductive, gold particles, wherein the gold particles have a particle diameter of about 1 nm to about 1 micron and are present in an amount of about 0.0001 to less than 0.01 wt % based on the weight of the paste composition; and
   (d) an organic vehicle.

2. The composition according to claim 1, comprising about 40 to about 95% silver particles, about 0.5 to about 6% glass fit, about 0.0001 to less than 0.01 wt % gold, and about 5 to about 30% organic vehicle, all percentages being by weight based on a total weight of the composition.

3. The composition according to claim 1, further comprising about 0.1 to about 5 weight % tantalum pentoxide particles.

4. The composition according to claim 3, wherein the tantalum pentoxide particles have a particle diameter of less than about 5 microns.

5. The composition according to claim 1, wherein the gold particles have a particle diameter of about 1 nm to about 500 nm.

6. The composition according to claim 1, wherein the gold particles are in a form of a metal organic compound.

7. A solar cell electrode formed by applying an electroconductive paste composition to a substrate and firing the paste to form the electrode, wherein the electroconductive paste composition comprises:
   (a) silver particles;
   (b) glass frit;
   (c) fine, electrically conductive, gold particles, wherein the gold particles have a particle diameter of about 1 nm to about 1 micron and are present in an amount of about 0.0001 to less than 0.01 wt % based on the weight of the paste composition; and
   (d) an organic vehicle.

* * * * *